United States Patent
Sio et al.

(10) Patent No.: US 11,437,998 B2
(45) Date of Patent: Sep. 6, 2022

(54) INTEGRATED CIRCUIT INCLUDING BACK SIDE CONDUCTIVE LINES FOR CLOCK SIGNALS

(71) Applicant: TAIWAN SEMICONDUCTOR MANUFACTURING COMPANY, LTD., Hsinchu (TW)

(72) Inventors: Kam-Tou Sio, Hsinchu County (TW); Jiun-Wei Lu, Keelung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/186,256

(22) Filed: Feb. 26, 2021

(65) Prior Publication Data

US 2021/0344346 A1    Nov. 4, 2021

Related U.S. Application Data

(60) Provisional application No. 63/017,905, filed on Apr. 30, 2020.

(51) Int. Cl.
*H03K 19/17736* (2020.01)
*H03K 19/17784* (2020.01)
*G06F 1/10* (2006.01)

(52) U.S. Cl.
CPC ........... *H03K 19/1774* (2013.01); *G06F 1/10* (2013.01); *H03K 19/17784* (2013.01)

(58) Field of Classification Search
None
See application file for complete search history.

(56) References Cited

U.S. PATENT DOCUMENTS

| 6,037,822 A * | 3/2000 | Rao ...................... H01L 23/481 |
| | | 257/698 |
| 11,158,580 B2 * | 10/2021 | Sio .......................... H01L 25/18 |
| 2008/0218235 A1 * | 9/2008 | Sekine ............... H03K 3/35625 |
| | | 327/212 |
| 2021/0118805 A1 * | 4/2021 | Sio ...................... H01L 23/5386 |

FOREIGN PATENT DOCUMENTS

| CN | 105210047 A | 12/2015 |
| CN | 108141346 A | 6/2018 |
| TW | 201816943 A | 5/2018 |
| TW | 201939893 A | 10/2019 |

* cited by examiner

*Primary Examiner* — Jany Richardson
(74) *Attorney, Agent, or Firm* — Birch, Stewart, Kolasch & Birch, LLP

(57) ABSTRACT

An integrated circuit is disclosed, including a first latch circuit, a second latch circuit, and a clock circuit. The first latch circuit transmits multiple data signals to the second latch circuit through multiple first conductive lines disposed on a front side of the integrated circuit. The clock circuit transmits a first clock signal and a second clock signal to the first latch circuit and the second latch circuit through multiple second conductive lines disposed on a backside, opposite of the front side, of the integrated circuit.

20 Claims, 11 Drawing Sheets

INTEGRATED CIRCUIT INCLUDING BACK SIDE CONDUCTIVE LINES FOR CLOCK SIGNALS

CROSS-REFERENCE

The present application claims priority to U.S. Provisional Patent Application No. 63/017,905, filed on Apr. 30, 2020, which is incorporated by reference herein in its entirety.

BACKGROUND

The semiconductor integrated circuit (IC) industry has experienced rapid growth. Technological advances in IC materials and design have produced generations of ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
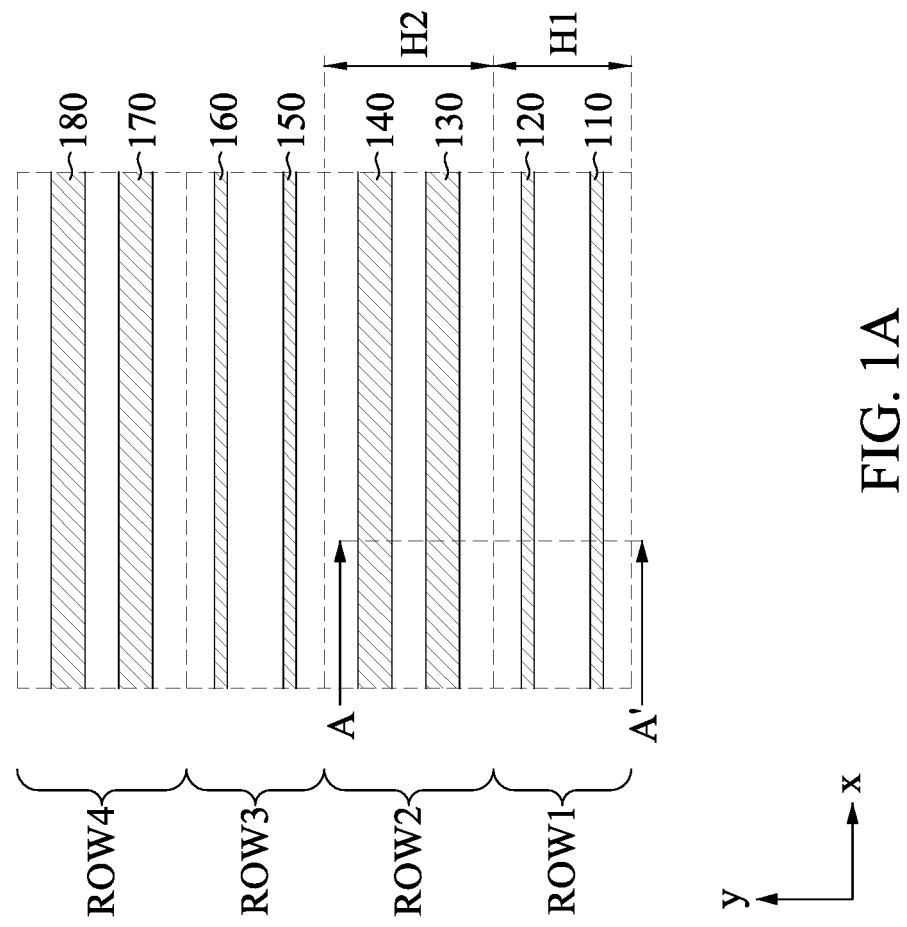
FIG. 1A is a top view diagram of part of an integrated circuit, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

Reference is now made to FIG. 1A. FIG. 1A is a top view diagram of part of an integrated circuit 10, in accordance with some embodiments. As illustratively shown in FIG. 1A, the integrated circuit 10 includes several cell rows ROW1-ROW4. In some embodiments, there are cells, for example, cells illustrated in FIGS. 3A-3C, and 4-5, are implemented by integrated circuits arranged in these cell rows ROW1-ROW4. The number of the cell rows ROW1-ROW4 in the integrated circuit 10 in FIG. 1A is given for illustrative purposes. Various numbers of the cell rows ROW1-ROW4 are within the contemplated scope of the present disclosure. For example, in some embodiments, the number of the cell rows in the integrated circuit 10 is more than 4.

For illustration, the cell rows ROW1-ROW4 extend along x direction and are parallel to each other. In some embodiments, the cell rows ROW1-ROW4 are arranged along y direction, which is substantially perpendicular to the x direction.

In some embodiments, there are two groups of cell rows among the rows ROW1-ROW4 in reference with their row heights. As illustratively shown in FIG. 1A, each of the cell rows ROW1 and ROW3 is configured to have a row height H1, and each of the cell rows ROW2 and ROW4 is configured to have another row height H2, which is shorter than the row height H1. The cell rows ROW1 and ROW3 with the row height H1 are regarded as a first group "A" of the cell rows ROW1-ROW4, and the cell rows ROW2 and ROW4 are regarded as a second group "B" of the cell rows ROW1-ROW4. In some embodiments, as depicted in FIG. 1A, the first group A of the cell rows and the second group B of the cell rows are interlaced.

For illustration, the cell row ROW1 with the row height H1 in the first group "A" includes two active areas 110-120, and the cell row ROW2 with the row height H2 in the second group "B" includes two active areas 130-140. Similarly, the cell row ROW3 includes two active areas 150-160, and the cell row ROW4 includes two active areas 170-180. For illustration, the active areas 110-180 extend along x direction and are separate from each other in y direction. The configurations of the active areas 110-180 will be discussed in the following paragraphs with FIG. 1B.

In some embodiments, the active areas 120 and 140 have a conductivity of P type, while the active areas 110 and 130 have a conductivity of N type. The configurations of the active areas 150 and 180 are similar to the active areas 110 and 140, and the configurations of the active areas 160 and 170 are similar to the active areas 120 and 130. Alternatively stated, the cell rows ROW1-ROW4 are interlaced in a periodic sequence along y direction. The configurations of the active areas 110-180 are given for illustrative purposes. Various implements of the active areas 110-180 are included in the contemplated scope of the present disclosure. For example, in some embodiments, the active areas 110, 140, 150, and 180 are N type and the active areas 120, 130, 160 and 170 are P type.

The configurations of the integrated circuit 10 of FIG. 1A are given for illustrative purposes. Various implements of the integrated circuit 10 are includes in the contemplated scope of the present disclosure. For example, in some embodiments discussed in the following paragraphs, the cell rows are arranged in sequence different from the cell rows ROW1 to ROW4, such like, in sequence ROW1, ROW2, ROW4, and ROW3. Alternatively stated, the cell rows having the same height are arranged abutted each other.

Figure 1B:
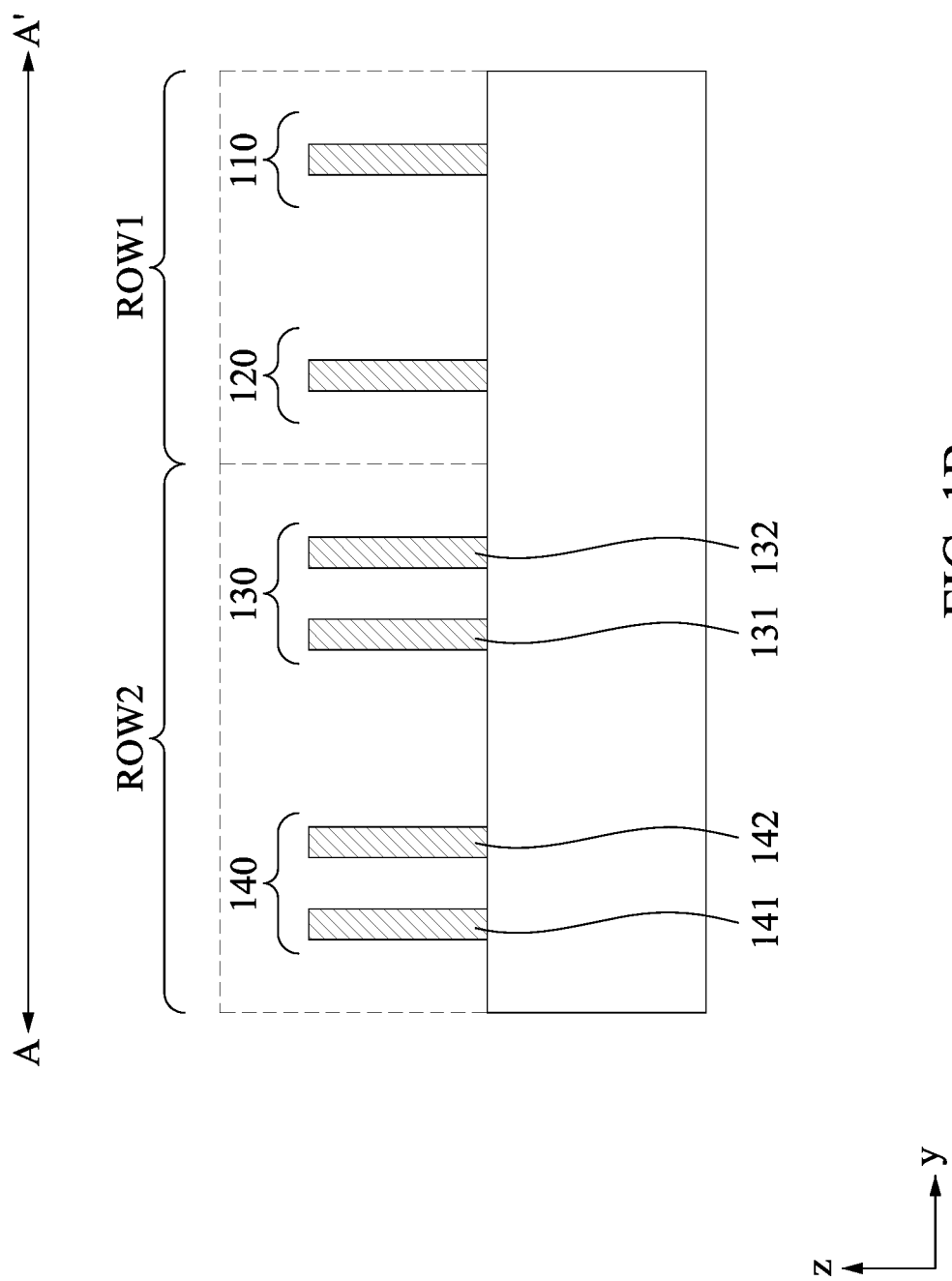
FIG. 1B is a sectional view diagram illustrating a structure of some cell rows along a sectional line in FIG. 1A, according to some embodiments of the present disclosure.

Reference is now made to FIG. 1B. FIG. 1B is a sectional view diagram illustrating a structure of the cell rows ROW3-ROW4 along a sectional line AA' in FIG. 1A in accordance with some embodiments. With respect to the embodiments of FIG. 1A, like elements in FIG. 1B are designated with the same reference numbers for ease of understanding.

As illustratively shown in FIG. 1B, the cell row ROW1 with the row height H1 in the second group "A" includes two active areas 110-120 on the substrate Sub. The active area 110 of the cell row ROW1 includes a first one fin-shaped structure, and the active area 120 of the cell row ROW1 includes a second one fin-shaped structure. Alternatively stated, each one of the active areas 110-120 includes one fin-shaped structure.

As illustratively shown in FIG. 1B, the cell row ROW2 with the row height H1 in the first group "B" includes the active areas 130-140 on a substrate Sub. The active area 130 of the cell row ROW2 includes two fin-shaped structures 131 and 132, and the active area 140 of the cell row ROW2 includes another two fin-shaped structures 141 and 142. Alternatively stated, each one of the active areas 130-140 include two fin-shaped structures, such as 131 and 132, or 141 and 142.

In some embodiments, the fin-shaped structures 131 and 132 are n-type fin-shaped structures, and the fin-shaped structures 141 and 142 are p-type fin-shaped structures. In some other embodiments, the fin-shaped structures 131 and 132 are p-type fin-shaped structures, and the fin-shaped structures 141 and 142 are n-type fin-shaped structures.

The fins mentioned above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, such an active area may include one or more fin-shaped structures of one or more three-dimensional field-effect-transistors (e.g., FinFETs, gate-all-around (GAA) transistors), or an oxide-definition (OD) region of one or more planar metal-oxide-semiconductor field-effect transistors (MOSFETs). The active region may serve as a source feature or a drain feature of the respective transistor (s).

In some embodiments, the active area 130 of the cell row ROW2 includes two fin-shaped structures 131 and 132 together as an active region to form an integrated circuit component (such as a transistor), such that an equivalent width of the active region of the integrated circuit component disposed on the active area 130 will be wider than one of another integrated circuit component disposed on the active area 110, which includes the first one fin-shaped structure. Alternatively stated, in some embodiments, integrated circuit components disposed on the cell row ROW2 have a better performance, for example, faster computing speed, than integrated circuit components disposed on the cell row ROW1.

Figure 2A:
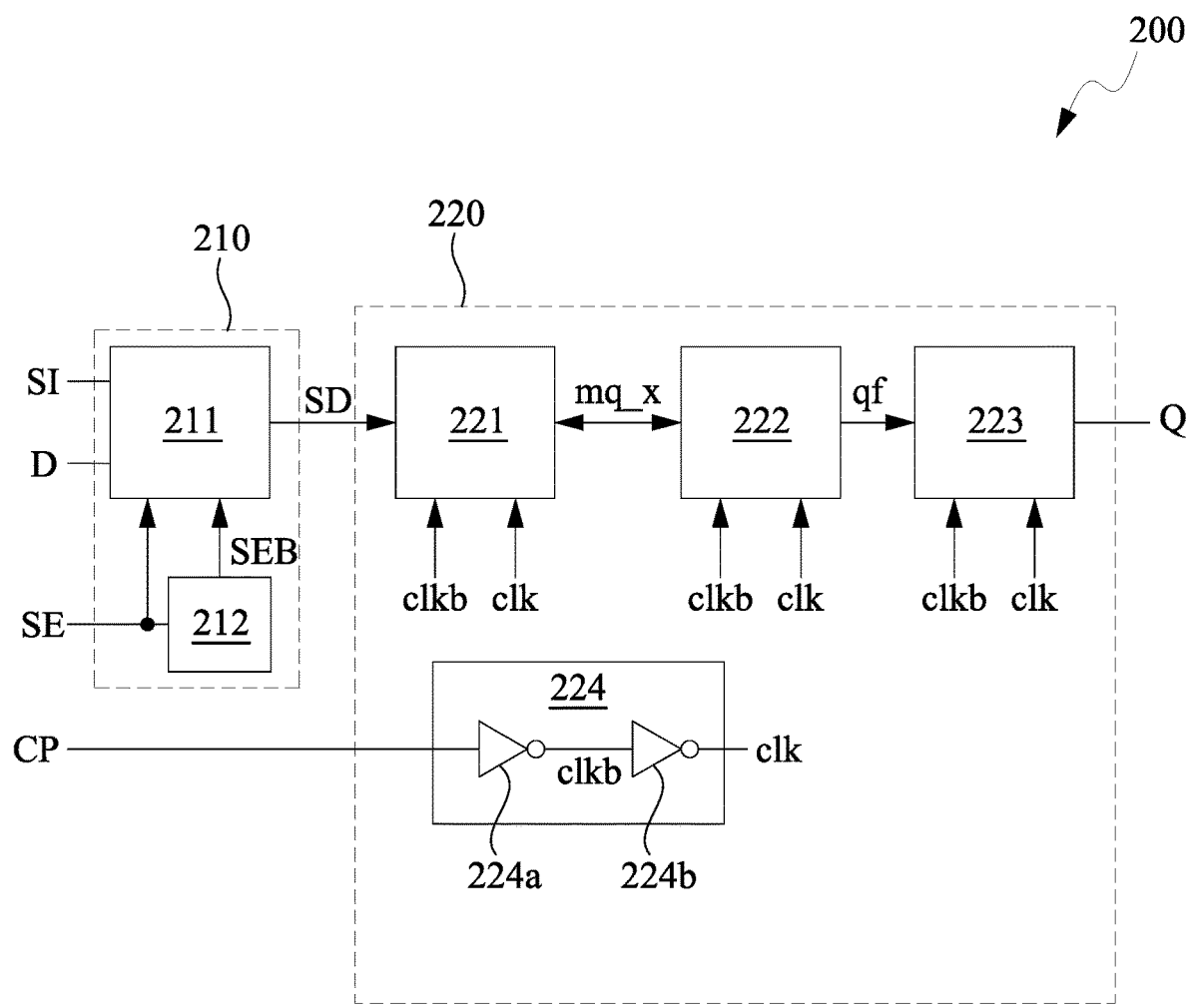
FIG. 2A is a schematic diagram of an integrated circuit, according to some embodiments of the present disclosure.

Reference is now made to FIG. 2A. FIG. 2A is a schematic diagram of an integrated circuit, according to some embodiments of the present disclosure. In some embodiments, the integrated circuit includes a scan flip-flop circuit 200 formed in the integrated circuit 10 of FIG. 1A. For illustration, the scan flip-flop circuit 200 includes a scan multiplexer 210 and a flip-flop circuit 220. In some embodiments, the scan multiplexer 210 includes a scan mux input circuit 211 and a scan enable inverter 212. The flip-flop circuit 220 includes a master latch circuit 221, a slave latch circuit 222, a data out circuit 223, and a clock circuit 224 including clock inverters 224a and 224b.

In some embodiments, the scan mux input circuit 211 receives a scan data input SI (i.e., a test vector signal, such used in Built-In-Self-Test (BIST) scanning or boundary test scanning), normal data input D (i.e., actual application data rather than test data), a scan enable signal SE, and a scan enable bar signal SEB transmitted from the scan enable inverter 212. In operation, the scan enable signal SE governs whether the scan data input SI or the normal data input D is selected. For example, if the scan enable signal SE is enabled (e.g., set to a logical "1"), the scan multiplexer 210 outputs the scan data input SI as a selected data SD. On the other hand, if the scan enable signal SE is disabled (e.g., set to a logical "0"), the scan multiplexer 210 outputs normal data input D as the selected data SD.

In some embodiments, the master latch circuit 221 and the slave latch circuit 222 are cross-coupled to store a data state in mutually reinforcing fashion, and each receives clock signals clkb and clk. In various embodiments, a signal mq_x is transmitted between the master latch circuit 221 and the slave latch circuit 222. The data out circuit 223 has an input coupled to an output of the slave latch circuit 222 to receive a signal of and outputs the data out signal Q. The clock signals clkb and clk are based on a clock signal CP and are provided by the clock circuit 224. The clock inverter 224a inverts the clock signal CP and outputs the clock signal clkb, and the clock inverter 224b inverts the clock signal clkb and output the clock signal clk. Accordingly, the clock signals clk and clkb are out-of-phase.

In operation, the flip-flop circuit 220 receives the selected data SD and generates an output data signal Q. The output data signal Q is based on the present state stored in the flip-flop circuit 220, the selected data SD, and the clock signal CP. The output data signal Q "flips" and "flops" between a "1" state and a "0" state in a manner that depends on the selected data SD and the clock signal CP. In some embodiments, the flip-flop circuit 220 continues to output its currently stored state as output data signal Q until the clock signal CP exhibits a rising and/or falling edge (regardless of changes in the selected data SD). When the clock signal CP exhibits a rising and/or falling edge, only then the flip-flop circuit 220 "stores" the present state of the selected signal SD and delivers this state as the output data signal Q.

Figure 2B:
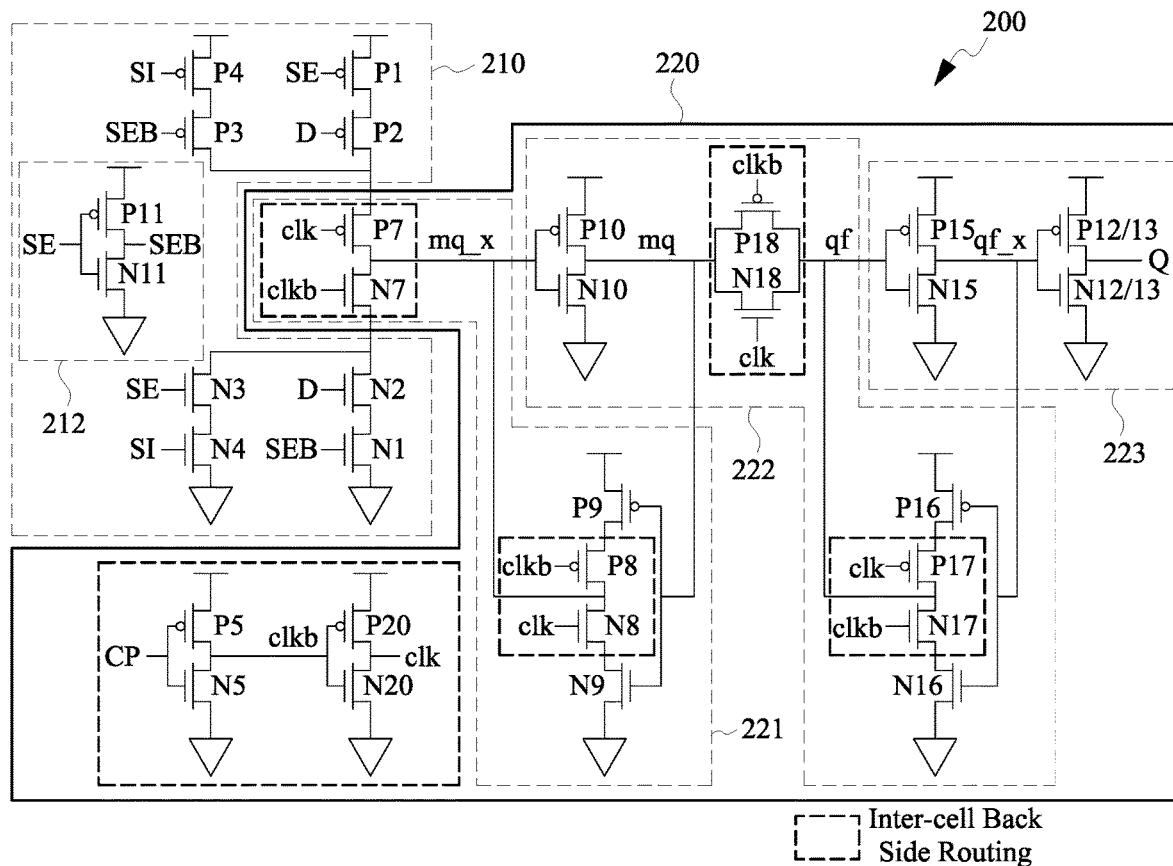
FIG. 2B is a detailed circuit of the scan flip flop circuit of FIG. 2A, according to some embodiments of the present disclosure.

Reference is now made to FIG. 2B. FIG. 2B is a detailed circuit of the scan flip flop circuit 200 of FIG. 2A, according to some embodiments of the present disclosure. As shown in FIG. 2B, the scan flip flop circuit 200 includes P-type transistors P1-P5, P7-P13, P15-P18, P20 and N-type transistors N1-N5, N7-N13, N15-N18, N20.

Specifically, the transistors P1-P4, P11, N1-N4, and N11 are operably coupled to form the scan multiplexer 210 while the transistors P11-N11 are configured to form the scan enable inverter 212. The master latch circuit 221 includes the transistors P7, N7 establish an inverter coupled to the scan multiplexer 210, and further includes the transistors P8-P9, N8-N9 establish another inverter which is selectively enabled based on the clock signals clk and clkb. An inverter of the transistors P10, N10 and a transmission gate of P18, N18 couple the master latch circuitry 104 to slave latch circuit 222. The transistors P10, P16-P18, N10, and N16-N18 are operably coupled to form slave latch circuit 222, while an inverter of the transistors P10, N10 and a transmission gate of the transistor P18, N18 couple the master latch circuit 221 to the slave latch circuit 222. The transistors P16-P17 and N16-N17 establish an inverter which is selectively enabled based on the clock signals clkb and clkb. The data out circuit 223 includes an inverter of the transistors P15 and N15 and another inverter of the transistors P12-P13 and N12-N13. Accordingly, the data output signal Q has the same polarity (i.e., is non-inverted) with regards to the original data inputs D and SI. Transistors N5, P5 make up the clock inverter 224a while the transistors N20, P20 make up the clock inverter 224b.

The configurations of FIGS. 2A-2B are given for illustrative purposes. Various implements are within the contemplated scope of the present disclosure. For example, in some embodiments, the functional blocks depicted in FIG. 2B are re-drawn. As an example, the transistors P7 and N7 are included in the scan multiplexer 210, the transistors P10, P18 and N10,N18 are included in the master latch circuit 222, and the transistors P15 and N15 are included in the slave latch circuit 222.

Figure 3A:
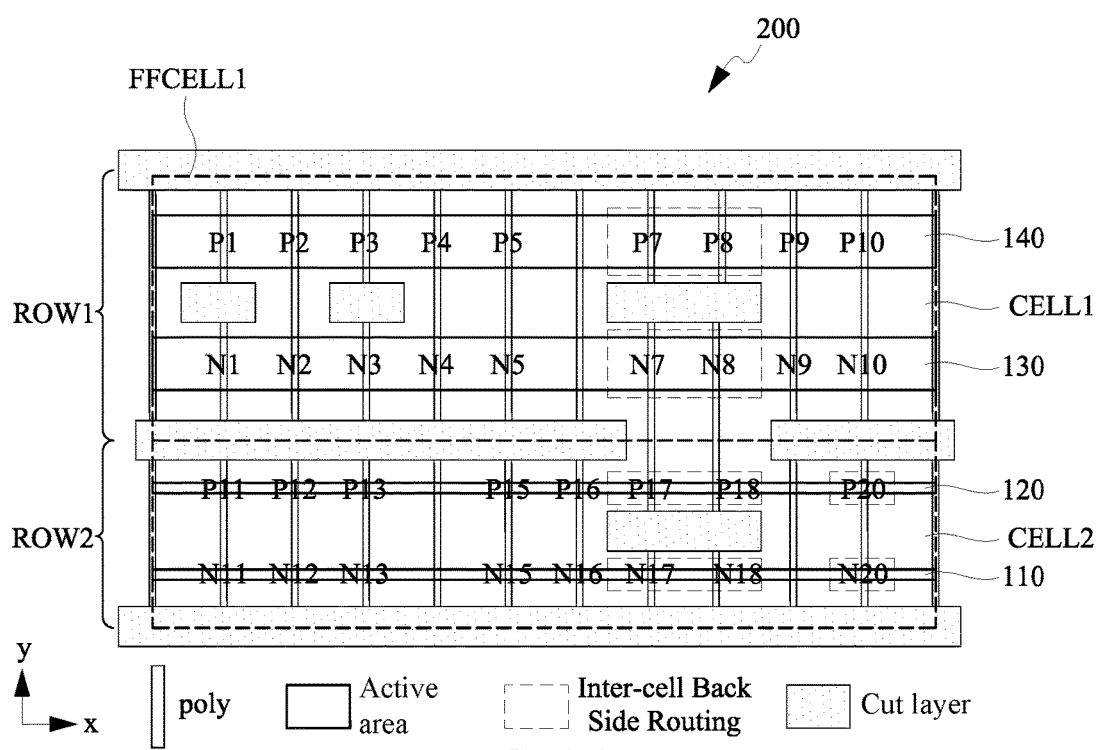
FIGS. 3A-3B illustrate layout diagrams in a plan view of part of a front side of the scan flip flop circuit in FIG. 2B, according to some embodiments of the present disclosure.
Figure 3B:
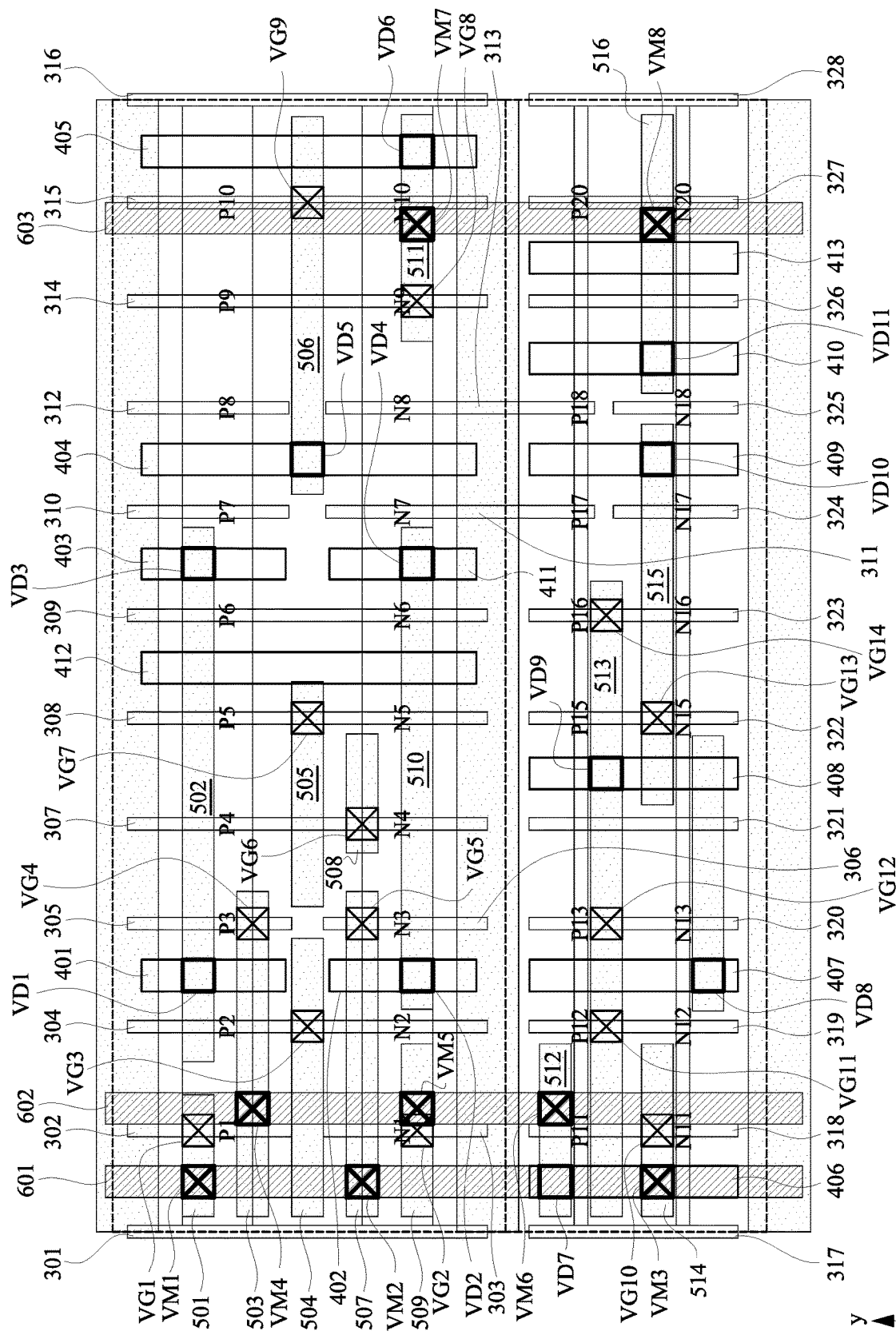
Figure 3C:
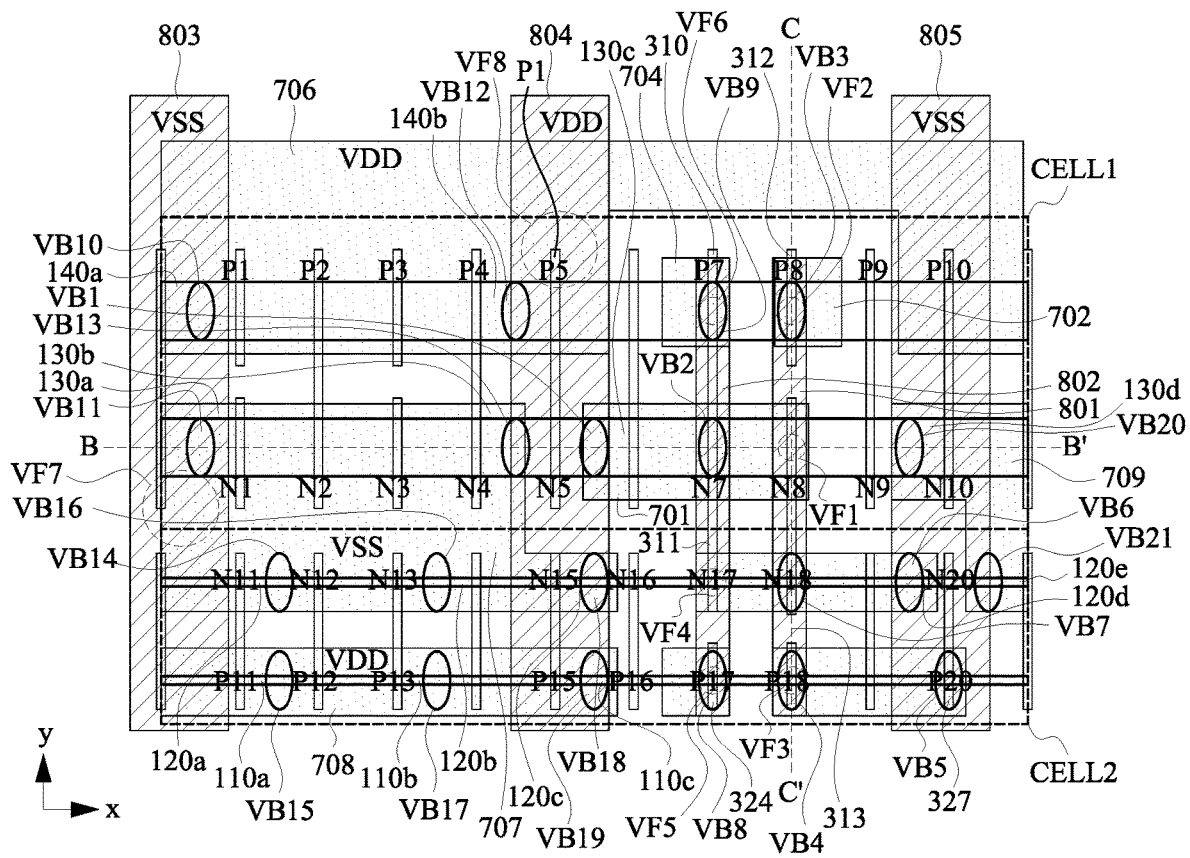
FIG. 3C illustrates layout diagram and cross-section views of part of a back side of the scan flip flop circuit in FIG. 2B, according to some embodiments of the present disclosure.

FIGS. 3A-3C depict several layout views of portions of the scan flip flop circuit 200 to illustrate the configurations thereof. FIGS. 3A-3B illustrate layout diagrams in a plan view of part of a front side of the scan flip flop circuit 200 in FIG. 2B, and FIG. 3C illustrates layout diagram and cross-section views of part of a back side of the scan flip flop circuit in FIG. 2B, according to some embodiments of the present disclosure. In some embodiments, the scan flip flop circuit 200 in the integrated circuit 10 includes an active semiconductor device (i.e., with drain/source structure implements with active areas, gate structures, metal-on-device MD on the active areas, front side metal routing, etc.) on its front side and some metal routing on its back side. In some embodiments, the active semiconductor device on the front side of the scan flip flop circuit 200 is formed on a substrate (not shown) in a front side process. After the front side process is complete, the integrated circuit is flipped upside down, such that a backside surface of the substrate faces upwards. The substrate is further thinned down and removed. In some embodiments, thinning is accomplished by a CMP process, a grinding process, or the like. Accordingly, backside process is performed to form structures on the back side of the integrated circuit 100. The details of manufacturing process will be discussed later.

Reference is now made to FIG. 3A. For illustration, the scan flip flop circuit 200 is configured to be formed in a flip flop cell FFCELL1 and includes the active areas 110-120 in a cell CELL2 in the cell row ROW1, the active areas 130-140 in a cell CELL1 in the cell row ROW2, and gates shown as "poly" which are typically made of doped polysilicon or metal, extend over at least one of the active areas 110-140, and cover channel regions thereof. For illustration, the gates extend in y direction while the active areas 110-140 extend in x direction.

In some embodiments, the gates are formed by multiple cut layers separating continuous gates, as shown in FIG. 3A. In some embodiments, the arrangements of the transistors P1-P5, P7-P13, P15-P18, P20, N1-N5, N7-N13, N15-N18, and N20 corresponding to those in FIG. 2B are shown in FIG. 3A with notations on the gates. Specifically, each of the transistors P1-P5, P7-P10 and N1-N5, N7-N10 includes a first quantity of fin structures, for example, two fin structures, formed in the active area 130 or 140, while each of the transistors P11-P13, P15-P20 and N11-N13, N15-N20 includes a second quantity of fin structures, for example, one fin structure, formed in the active area 120 or 110.

Reference is now made to FIG. 3B which depicts the layout of FIG. 3A in a more detailed way. As shown in FIG. 3B, the scan flip flop circuit 200 includes the gates 301-328, conductive segments (or metal on oxide-definition areas ("MOOD" or "MD")) 401-411, conductive lines (or metal-one layer (M1)) 501-517, conductive traces (or metal-two layer (M2)) 601-603, and vias VD1-VD11, VG1-VG14, and VM1-VM8. In some embodiments, the active areas 110-140 are disposed in a first layer on the front side of the scan flip flop circuit 200, while the gates 301-328 and the conductive segments 401-411 cross at least one of the active areas 110-140. The conductive lines 501-517 are disposed on a second layer, above the first layer in positive z direction, on the front side of the scan flip flop circuit 200, in which the z direction is perpendicular to both x and y directions and above the plane containing the x- and y-axes. The vias VD1-VD11 and VG1-VG14 are disposed between the first layer and the second layer. The conductive traces 601-603 are disposed in a third layer, above the second layer in positive z direction, on the front side of the scan flip flop circuit 200. The vias VM1-VM8 are disposed between the second layer and the third layer.

In some embodiments of the configurations in the front side of the scan flip flop circuit 200, as shown in the cell CELL1 in FIG. 3B, the gates 302-303 correspond to gates of the transistors P1 and N1. The gate 304 is shared as gates of the transistors P2 and N2. The gates 305-306 correspond to gates of the transistors P3 and N3. The conductive segment 401 corresponds to drains of the transistors P2-P3. The conductive segment 402 corresponds to drains of the transistors N2-N3. The gates 307-308 are shared respectively gates of the transistors P4, N4 and the transistors P5, N5. The conductive segment 405 corresponds to drains of the transistors P5 and N5. The gate 310 corresponds to a gate of the transistor P7, and the gate 311 is shared as gates of the transistor N7 and P17. The conductive segment 403 corresponds to a source of the transistor P7 and the conductive segment 411 corresponds to a source of the transistor N7. The gate 312 corresponds to a gate of the transistor P8, and the gate 313 is shared as gates of the transistor N8 and P18. The conductive segment 404 corresponds to drains of the transistors P7 and N7 and sources of the transistors P8 and N8. The gate 314 is shared as gates of the transistors P9 and N9. The gate 315 is shared as gates of the transistors P10 and N10. The conductive segment 405 corresponds to drains of the transistors P10 and N10.

Furthermore, in the cell CELL2, the gate 318 is shared as gates of the transistors P11 and N11. The conductive segment 406 corresponds to drains of the transistors P11 and N11. The gate 319 is shared as gates of the transistors P12 and N12. The conductive segment 407 corresponds to drains of the transistors P12, P13 and N12, N13. The gate 322 is shared as gates of the transistors P15 and N15. The conductive segment 408 corresponds to drains of the transistors P15 and N15. The gate 323 is shared as gates of the transistors P16 and N16. The gate 324 corresponds to a gate of the transistor N17, and the gate 325 corresponds to a gate of the transistor N18. The gate 327 is shared as gates of the transistors P20 and N20. The conductive segment 413 corresponds to drains of the transistors P20 and N20. The gates 301, 309, 316-317, 321, 326, and 328 are referred to as dummy gates, in which in some embodiments, the "dummy" gate is referred to as being not electrically connected as the gate for MOS devices, in which the term "dummy" corresponds to having no practical function in a circuit.

For illustration, the gates 301-328 and the conductive segments 401-409 extend in y direction and are separated from each other in x direction. The conductive lines 501 extend in x direction and are separated from each other in x or/and y direction. The conductive traces 601-603 extend in y direction and are separated from each other in x direction.

Reference is now made to FIG. 2B and FIG. 3B together. The conductive trace 601 transmits the scan enable signal SE to the gate 302 through the via VM1 which is coupled between the conductive trace 601 and the conductive line 501 and the via VG1 which is coupled between the conductive line 501 and the gate 302, also to the gate 306 through the via VM2 which is coupled between the conductive trace 601 and the conductive line 507 and the via VG5 which is coupled between the conductive line 507 and the gate 306, and to the gate 318 through the via VM3 which is coupled between the conductive trace 601 and the conductive line 514 and the via VG10 which is coupled between the conductive line 514 and the gate 318.

The scan enable bar signal SEB is output from the conductive segment 406 to the conductive trace 602 through the via VD7 which is coupled between the conductive segment 406 and the conductive line 512 and the via VM6 which is coupled between the conductive line 512 and the conductive trace 602. The scan enable bar signal SEB is further transmitted to the gate 303 through the via VM5 which is coupled between the conductive trace 602 and the conductive line 509 and the via VG2 which is coupled between the conductive line 509 and the gate 303, and also transmitted to the gate 305 through the via VM4 which is coupled between the conductive trace 602 and the conductive line 503 and the via VG4 which is coupled between the conductive line 503 and the gate 305.

The conductive line 504 transmits the data signal D to the gate 304 through the via VG3 which is coupled between the conductive line 504 and the gate 304. The conductive line 505 transmits the clock signal CP to the gate 308 through the via VG7 which is coupled between the conductive line 505 and the gate 308.

The conductive line 508 transmits the scan data input SI to the gate 307 through the via VG6 which is coupled between the conductive line 508 and the gate 307.

The conductive segment 401 is coupled to the conductive segment 403 through the via VD1 which is coupled between the conductive line 502 and the conductive segment 401 and the via VD3 which is coupled between the conductive line 502 and the conductive segment 403. Accordingly, the drains of the transistors P2-P3 is coupled to the source of the transistor P7.

The conductive segment 402 is coupled to the conductive segment 411 through the via VD2 coupled between the conductive line 510 and the conductive segment 402 and the via VD4 coupled between the conductive line 510 and the conductive segment 411. Accordingly, the drains of the transistors N2-N3 are coupled to the source of the transistor N7.

The conductive segment 404 is coupled to the conductive line 506 through the via VD5 and further coupled to the gate 315. Accordingly, the drains of the transistors P7 and N7 are coupled to the gates of the transistors P10 and N10. The conductive segment 405 is coupled to the conductive line 513 through the via VD6, and further coupled to the gate 314 through the via VG8. Accordingly, the drains of the transistors P10 and N10 are coupled to the gates of the transistors P9 and N9. The conductive line 513 is coupled to the conductive trace 603 through the via VM7, and the via VM8 couples the conductive trace 603 to the conductive line 516. The conductive line 516 is coupled to the conductive segment 410 through the via VD11. Therefore, the drains of the transistors P10 and N10 are coupled to the sources/the drains of the transistors P18 and N18 as well.

The conductive segment 409 is coupled to the conductive line 515 through the via VD10, and the conductive line 515 is coupled to the gate 322 through the via VG13. Accordingly, the drains/sources of the transistors P18 and N18 are coupled to the gates of the transistors P15 and N15. The conductive segment 408 is coupled to the conductive line 513 through the via VD9. The conductive line 513 is coupled to the gates 319-320 and 323 separately through the vias VG11-VG12 and VG14. Accordingly, the drains of the transistors P15 and N15 are coupled to the gates of the transistors P12-P13, P16, N12-N13, and N16.

The conductive segment 407, corresponding to the drains of the transistors P12-P13 and N12-N13, is coupled to the conductive line 517 through the via VD8. In some embodiments, the output signal Q is transmitted out from the scan flip flop circuit 200 through the routing coupled to the conductive segment 407.

With the configurations of the FIGS. 2A-3B, the scan multiplexer 210, the master latch circuit 221, the slave latch circuit 222, and the data out circuit 223 are configured to transmits the data signals, such as the scan enable signal SE, the scan enable bar signal SEB, the signals mq_x, mq, qf, and qf_x, etc, through the routing on the front side of the scan flip flop circuit 200, for example, the conductive segments 401-411, the conductive lines 501-517, and the conductive trace 601-603.

Reference is now made to FIG. 3C. In some embodiments of the configurations in the back side of the scan flip flop circuit 200, the clock circuit 224 is configured to transmit the clock signals clk and clkb to the master latch circuit 221 and the slave latch circuit 222 through routing on the back side of the scan flip flop circuit 200. Cross-sectional views of part of the scan flip flop circuit 200 taken along a line B-B' and a line C-C' are given for better understanding of FIG. 3C.

For illustration, the scan flip flop circuit 200 further includes back side conductive lines (i.e., back side metal one layer, "M-1") 701-710, back side conductive lines (i.e., back side metal two layer, "M-2") 801-805, and vias VB1-VB21, VF1-VF8. In some embodiments, the back side conductive lines 701-710 are disposed in a fourth layer below the first layer including the active device. The back side conductive lines 801-805 are disposed in a fifth layer below the fourth layer. Alternatively stated, the fourth layer is closer to the front side of the scan flip flop circuit 200 than the fifth layer, and the fourth layer is interposed between the first and fifth layers. The vias VB1-VB21 are disposed between the first layer and the fourth layer. The vias VF1-VF8 are disposed between the fourth layer and the fifth layer.

Reference is now made to both FIGS. 2B, 3A and 3C. In some embodiments, with regard to transmitting the clock signals clkb and clk, a detailed layout diagram of the components circled as "inter-cell back side routing" in FIGS. 2B and 3A is presented in FIG. 3C. For example, as mentioned above, the clock signal CP is transmitted to the gate 308 of the transistors P5 and N5. In response to the clock signal CP, the clock signal clkb is output at the drains of the transistors N5 and P5. As shown in FIG. 3C, an active region 130b, included in the active area 130, corresponding to the drain of the transistor N5 is coupled to the back side conductive line 701 through the via VB1. The back side conductive line 701 is further coupled to the gate 311, corresponding to the gate of the transistor N7, through the via VB2. Moreover, the via VF1 couples the back side conductive line 701 to the back side conductive line 801. The back side conductive line 801 is coupled to the back side conductive lines 702 and 703 through the vias VF2-VF3 separately. The via VB3 couples the back side conductive line 702 to the gate 312 corresponding to the gate of the transistor P8. The via VB4 couples the back side conductive line 703 to the gate 325 corresponding to the gate of the transistor P18. The via VB5 further couples the back side conductive line 703 to the gate 327 corresponding to the gates of the transistors P20 and N20. Accordingly, the clock signal clkb generated by the transistors N5 and P5 is transmitted to the gates of the transistors N7, P8, P18, P20 and N20.

Similarly, in the embodiments of transmitting the clock signal clk, as shown in FIG. 3C, an active region 120b, included in the active area 120, corresponding to the drains of the transistors P20 and N20 is coupled to the back side conductive line 705 through the via VB6. The back side conductive line 705 is further coupled to the gate 313, corresponding to the gates of the transistors N8 and P18, through the via VB7. Moreover, the via VF4 couples the back side conductive line 705 to the back side conductive line 802. The back side conductive line 802 is coupled to the back side conductive lines 710 and 704 through the vias VF5-VF6 separately. The via VB5 couples the back side conductive line 710 to the gate 324 corresponding to the gate of the transistor P17. The via VB9 couples the back side conductive line 704 to the gate 310 corresponding to the gate of the transistor P7. Accordingly, the clock signal clk generated by the transistors N20 and P20 is transmitted to the gates of the transistors P7, N8, P17 and N18.

In some embodiments, the scan flip flop circuit 200 also receives supply voltages from the back side routing. For illustration, the back side conductive lines 803 and 805 are configured to input a supply voltage VSS (i.e., usually referred to as a ground voltage) for the scan flip flop circuit 200, and the back side conductive line 804 is configured to input a supply voltage VDD, greater than the supply voltage VSS. Furthermore, the via VF7 is coupled between the back side conductive line 803 and the back side conductive line 707 to transmit the supply voltage VSS to the back side conductive line 707. The via VF8 is coupled between the back side conductive line 804 and the back side conductive line 706 to transmit the supply voltage VDD to the back side conductive line 707.

As aforementioned, with reference to both FIGS. 2B and 3C, an active region 140a, corresponding to the source of the transistor P1, receives the supply voltage VDD through the via VB10 coupled between the active region 140a and the back side conductive line 706. An active region 130a, corresponding to the source of the transistor N1, receives the supply voltage VSS through the via VB11 coupled between the active region 130a and the back side conductive line 707. An active region 140b, corresponding to the sources of the transistors P4-P5, receives the supply voltage VDD through the via VB12 coupled between the active region 140b and the back side conductive line 706. An active region 130b, corresponding to the sources of the transistors N4-N5, receives the supply voltage VSS through the via VB13 coupled between the active region 130b and the back side conductive line 707. Similarly, active regions 120a-120c, corresponding to the sources of the transistors N11-N13 and N15-N16 separately, receive the supply voltage VSS through the vias VB14, VB16, and VB18, in which the vias VB14, VB16, and VB18 couple the back side conductive line 707 to the active regions 120a-120c separately.

In some embodiments, the flip flop cell FFCELL1 shares some of the back side conductive lines 701-710 with other abutting flip flop cell (not shown, will be discussed in the following paragraphs). The back side conductive line 708 provides the supply voltage VDD received from other flip flop cell, and accordingly, active regions 110a-110c, corresponding to the sources of the transistors P11-P13 and P15-P16 separately, receive the supply voltage VDD through the vias VB15, VB17, and VB19, in which the vias VB15, VB17, and VB19 couple the back side conductive line 708 to the active regions 110a-110c separately. Similarly, the back side conductive line 709 provides the supply voltage VSS received from other flip flop cell, and accordingly, active regions 130d and 120e, corresponding to the sources of the transistors N10 and N20 separately, receive the supply voltage VSS through the vias VB20 and VB21, in which the vias VB20 and VB21 couple the back side conductive line 709 to the active regions 130d and 120e separately.

Based on the above descriptions, the back side conductive lines, such like the back side conductive lines 706-709 and 803-805, configured to transmit the supply voltages VDD and VSS are referred to as power rails. In some embodiments, the back side conductive lines configured to transmit the clock signals clk and clkb are surrounded by or disposed beside the power rails in the same layer on the back side of the scan flip flop circuit 200 in a layout view. For example, as shown in FIG. 3C, at least one, such as the back side conductive lines 706-709, of the back side conductive lines 701-709 includes a first portion(s) extending in x direction and a second portion(s) extending in y direction. Alternatively stated, at least one of the back side conductive lines 706-709 is L-shaped. The back side conductive lines 801-805 extend in y direction. Accordingly, the back side conductive line 706 surrounds the back side conductive lines 702 and 704. The back side conductive lines 701 and 705 are interposed between the back side conductive lines 707 and 709. Furthermore, the back side conductive lines 801-802 are interposed between the back side conductive lines 804-805 in the fifth layer on the back side of the scan flip flop circuit 200.

In some approaches, clock signals are transmitted through metal routing on the front side of the integrated circuit while other data signals passing in proximate conductive lines. In such arrangements, the clock signals are vulnerable to be interfered by those data signals because of no shielding. In the embodiments of the present disclosure, by arranging the conductive lines configured to transmit the clock signals on the back side and interposed between the power rails on the back side, the power rails function as shielding to enhance noise immunity of the back side conductive lines while transmitting the clock signals.

The configurations of FIGS. 3A-3C are given for illustrative purposes. Various implements are within the contemplated scope of the present disclosure. For example, in some embodiments, there is further a via coupled between the back side conductive line 706 and an active region, corresponding the source of the transistor P10, to transmit the supply voltage VDD to the transistor P10. In various embodiments, a portion of a conductive line, configured with respect to the back side conductive line 708, overlaps the back side conductive line 805 and a via couples the portion of the conductive line to active region, corresponding the source of the transistor P20, to transmit the supply voltage VDD to the transistor P20.

Figure 4:
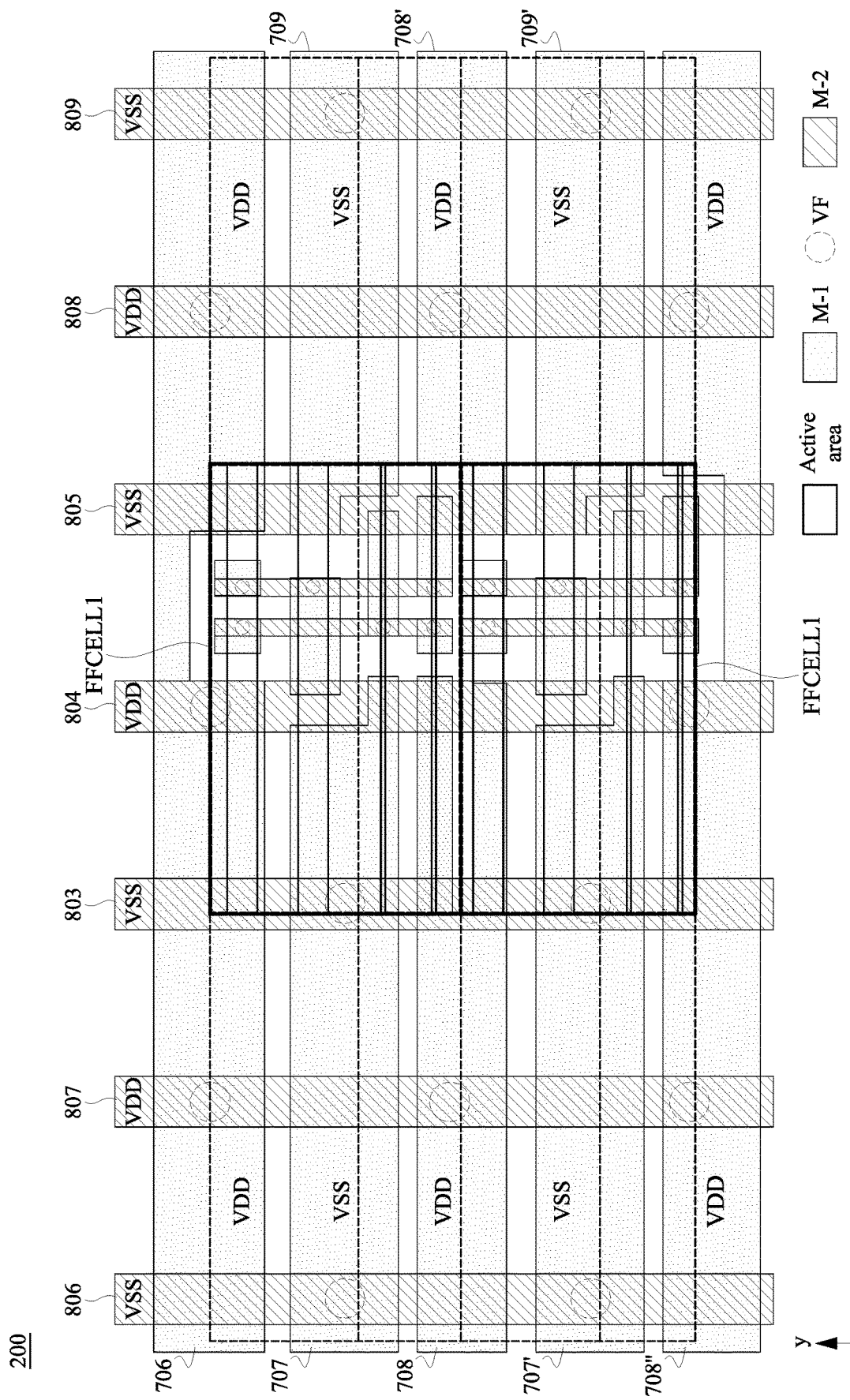
FIG. 4 is a layout diagram in a plan view of part of an integrated circuit, in accordance with various embodiments.

Reference is now made to FIG. 4. FIG. 4 is a layout diagram in a plan view of part of an integrated circuit 40, in accordance with various embodiments. With respect to the embodiments of FIGS. 1-3C, like elements in FIG. 4 are designated with the same reference numbers for ease of understanding. The specific operations of similar elements, which are already discussed in detail in above paragraphs, are omitted herein for the sake of brevity.

As shown in FIG. 4, the integrated circuit 40 includes multiple flip flop cells FFCELL1-FFCELL2 which have the same configurations. The flip flop cell FFCELL2 abuts the flip flop cell FFCELL1 in y direction. The flip flop cells FFCELL1-FFCELL2 are arranged in the cell rows having mixed cell heights which have the configurations similar to the integrated circuit 10 in FIG. 1A. Hence, the repetitious descriptions are omitted here.

In some embodiments, the flip flop cells FFCELL1-FFCELL2 are arranged along other cells in the integrated circuit 40 and share the back side conductive lines 706-709, 707', 708', 708", and 709'. For illustration, the back side conductive lines 706-709, 707', 708', 708", and 709' extend in x direction and pass the cell arranged in the cell rows. In addition, the back side conductive lines 706, 708, 708', and 708" receive the supply voltage VDD through the vias coupling to the back side conductive lines 804, 807, and 808. The back side conductive lines 707, 707', 709, and 709' receive the supply voltage VSS through the vias coupling to the back side conductive lines 803, 806, and 809. Alternatively stated, the flip flop cells FFCELL1-FFCELL2 also share the back side conductive lines 803-805 as the back side conductive lines 803-805 extend in y direction and pass through the flip flop cells FFCELL1-FFCELL2.

The configurations of FIG. 4 are given for illustrative purposes. Various implements are within the contemplated scope of the present disclosure. For example, in some embodiments, there are vias coupling the back side conductive lines 709 and 709' to the back side conductive line 805.

Figure 5:
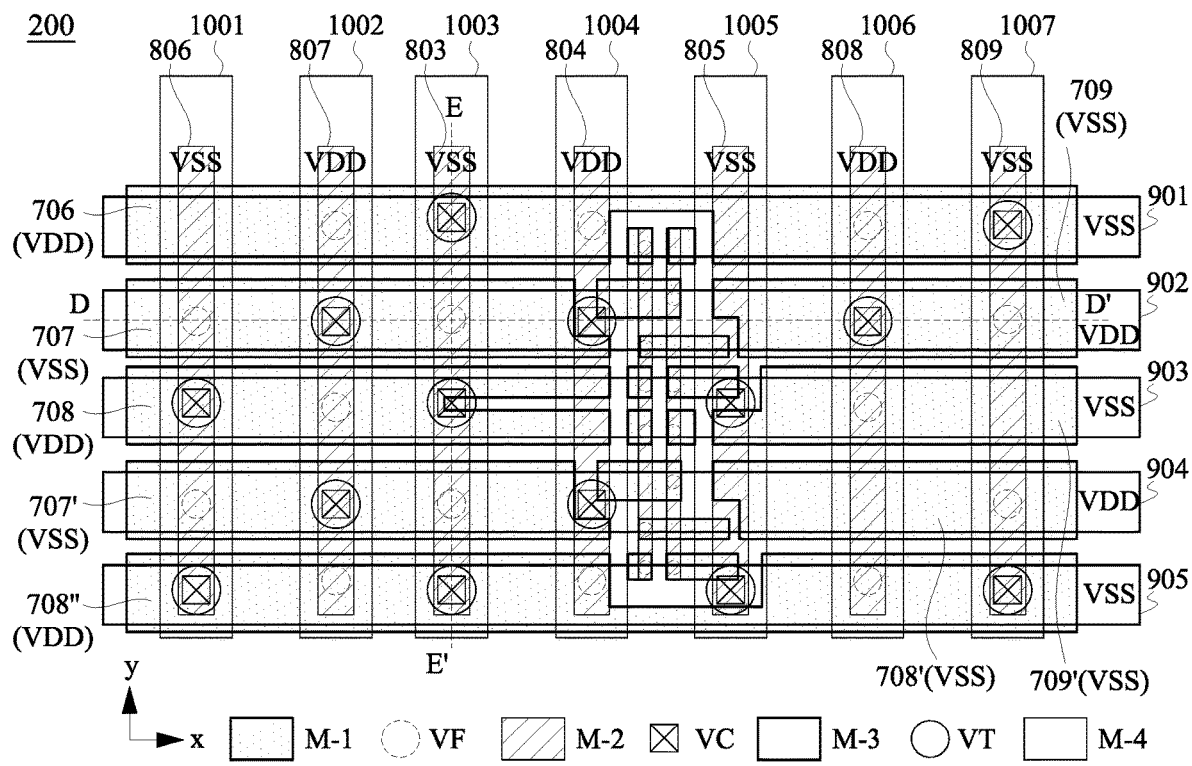
FIG. 5 illustrates layout diagram and cross-section views of part of an integrated circuit, in accordance with various embodiments.
Figure 5:
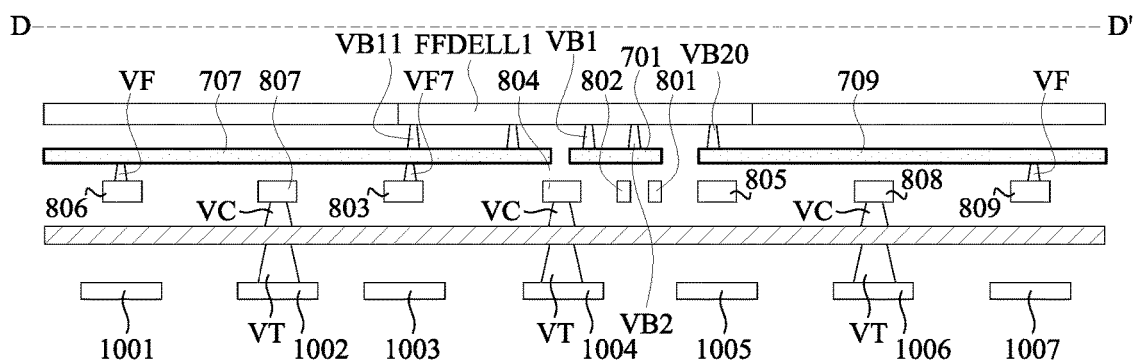
Figure 5:
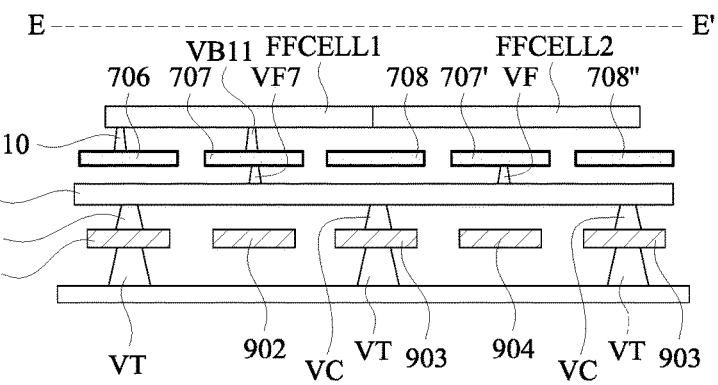

Reference is now made to FIG. 5. FIG. 5 illustrates layout diagram and cross-section views of part of an integrated circuit 50, in accordance with various embodiments. With respect to the embodiments of FIGS. 1-4, like elements in FIG. 5 are designated with the same reference numbers for ease of understanding. In some embodiments, the integrated circuit 50 is configured with respect to, for example, the integrated circuit 40 in FIG. 4. For the sake of brevity, the flip flop cells are not shown in the diagram. Cross-sectional views of part of the integrated circuit 50 taken along a line D-D' and a line E-E' are given for better understanding of FIG. 5.

Compared with FIG. 4, the integrated circuit 50 further includes back side conductive traces (i.e., back side metal three layer, "M-3") 901-905, back side conductive traces (i.e., back side metal four layer, "M-4") 1001-1007, and vias VC and VT. In some embodiments, the back side conductive traces 901-905 are disposed in a sixth layer below the fifth layer on the back side of the integrated circuit 50. The back side conductive traces 1001-1007 are disposed in a seventh layer below the sixth layer on the back side of the integrated circuit 50. The vias VC are disposed between the fifth and sixth layers on the back side of the integrated circuit 50. The vias VT are disposed between the sixth and seven layers on the back side of the integrated circuit 50.

For illustration, the back side conductive traces 901-905 extend in x direction and are separated from each other in y direction. The back side conductive traces 1001-1007 extend in y direction and are separated from each other in x direction.

In some embodiments, the back side conductive traces 1001-1007 are configured to transmit the supply voltages VDD and VSS to the back side conductive lines 706-709, 707', 708', 708", and 709' through the back side conductive line 803-809 and the back side conductive trace 901-905. For example, the back side conductive trace 1002 provides the supply voltage VDD to the back side conductive trace 902 through the vias VT. The back side conductive trace 902 couples to the back side conductive line 807 through the via VC. The back side conductive line 807 further is coupled to the 706 through the via VF. Accordingly, the supply voltage VDD is transmitted from the back side conductive trace 1002 to the back side conductive line 706 and further to the active devices.

Taking another example, along line E-E', the back side conductive trace 1003 is coupled to the back side conductive trace 901 through the via VT, and the back side conductive trace 901 is coupled to the back side conductive line 803 through the via VC. Moreover, with reference to both FIGS. 3C and 5, the back side conductive line 803 is coupled to the back side conductive line 707 through the via VF7. The back side conductive line 707 is coupled to the flip flop cell FFCELL1 through the via VB11. Accordingly, the supply voltage VSS is transmitted from the back side conductive trace 1003 to the flip flop cell FFCELL1. The configurations of the back side conductive traces 901-905 and the back side conductive traces 1001-1007 are similar to that of the back side conductive trace 902 and the back side conductive trace 1003. Hence, the repetitious descriptions are omitted here.

In some approaches, while clock signals are shared with multiple flip flop cells by the metal routing on the front side of an integrated circuit, it results in a circuit design of great complexity and area penalty. As shown in FIGS. 4 and 5, as power supply voltages and the clock signals are transmitted through the metal lines on the back side, an improved flexibility and utilization of routing is provided, and thus, the circuit design is optimized and the manufacturing cost is cut.

The configurations of FIG. 5 are given for illustrative purposes. Various implements are within the contemplated scope of the present disclosure. For example, in some embodiments, the number of the vias VC and VT is greater than that shown in FIG. 5.

Figure 6:
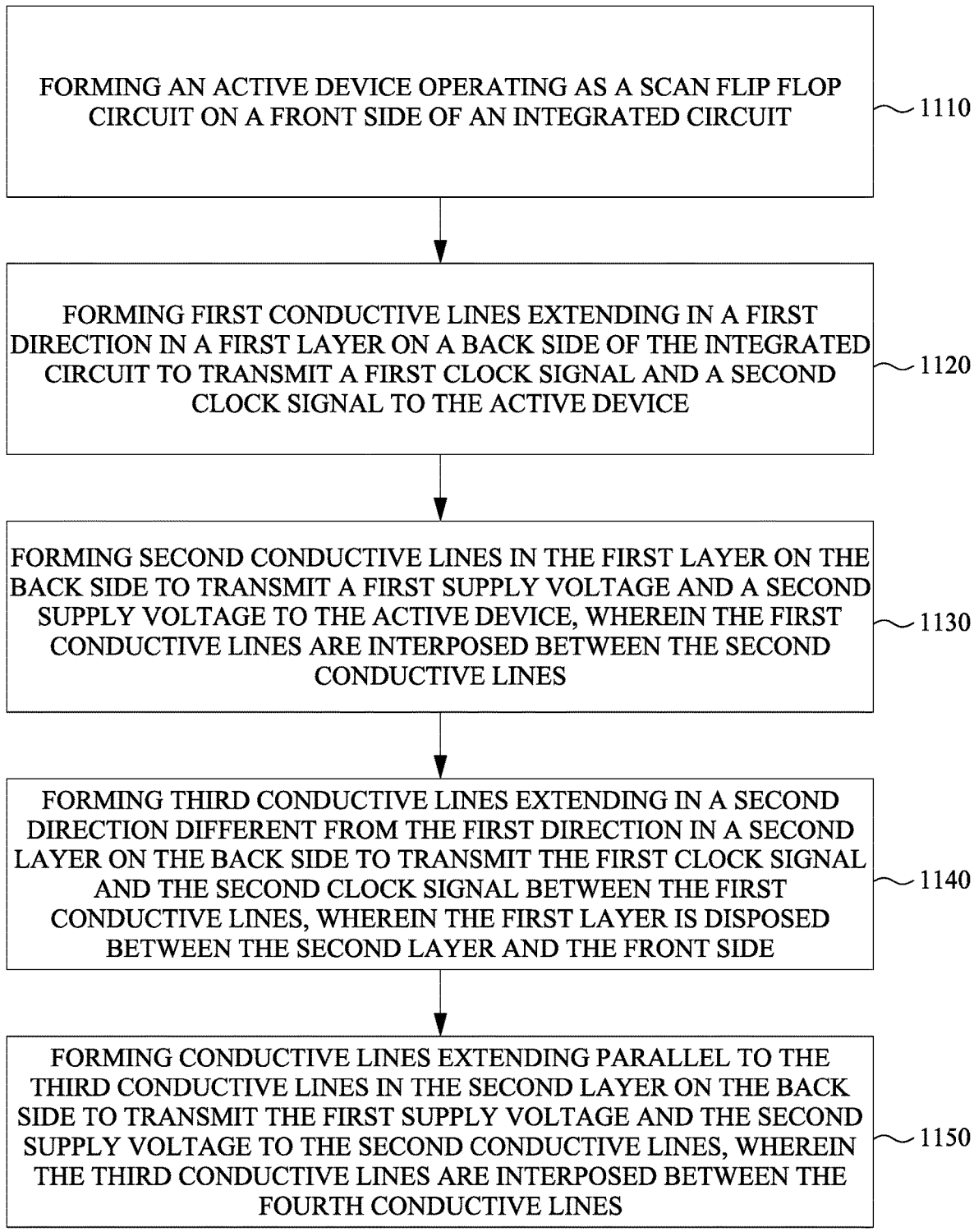
FIG. 6 is a flow chart of a method of manufacturing an integrated circuit, in accordance with some embodiments of the present disclosure.

FIG. 6 is a flow chart of a method 1100 of fabricating an integrated circuit including the integrated circuit 10, 40, or 50, in accordance with some embodiments of the present disclosure. It is understood that additional operations can be provided before, during, and after the processes shown by FIG. 6, and some of the operations described below can be replaced or eliminated, for additional embodiments of the method. The order of the operations/processes may be interchangeable. Throughout the various views and illustrative embodiments, like reference numbers are used to designate like elements. The method 1100 includes operations 1110-1150 that are described below with reference to the flip flop circuit 200 of FIGS. 3B-3C.

In operation 1110, the active device operating as the scan flip flop circuit 200 is formed on the front side of the integrated circuit 10, as shown in FIG. 3B. The active device includes active components, such as the transistors P1-P5, P7-P13, P15-P18, P20, N1-N5, N7-N13, N15-N18, and N20.

In some embodiments, after the active device is formed, the integrated circuit is flipped upside down for the back side processes.

In operation 1120, the back side conductive lines including, for example, the back side conductive lines 701-705 and 710, are formed to extend in x direction in the fourth layer (i.e., the layer below the first layer on the front side of the scan flip flop circuit 200, as mentioned above) on the back side of the integrated circuit 10 to transmit the clock signals clk and clkb to the scan flip flop circuit 200, as shown in FIG. 3C.

In operation 1130, other back side conductive lines including, for example, the back side conductive lines 706-709, are formed in the fourth layer on the back side of the integrated circuit 10 to transmit the supply voltages VSS and VDD to the scan flip flop circuit 200. As shown in FIG. 3C, for example, the back side conductive lines 701 and 705 are interposed between the back side conductive lines 707 and 709. The back side conductive lines 702 and 704 are surrounded by the back side conductive line 706.

In some embodiments, at least one of the back side conductive lines 706-709 includes a first portion extending in x direction and a second portion extending in y direction, for example, the back side conductive line 707 having a L shape.

In operation 1140, the back side conductive lines 801-802 are formed to extend in y direction in the fifth layer (i.e., the layer below the fourth layer on the back side of the scan flip flop circuit 200, as mentioned above) on the back side of the integrated circuit 10, as shown in FIG. 3C. The fourth layer is interposed between the fifth layer on the back side and the front side of the integrated circuit 10. The back side conductive lines 801-802 are configured to transmit the clock signals clk and clkb between the back side conductive lines 701-705 and 710.

In operation 1150, the back side conductive lines 803-805 extending parallel to the back side conductive lines 801-802 are formed in the fifth layer on the back side of the integrated circuit 10 to transmit the supply voltages VSS and VDD to the back side conductive lines 706-709, as shown in FIG. 3C. In some embodiments, the back side conductive lines 801-802 are interposed between the back side conductive lines 804 and 805.

In some embodiments, as shown in FIG. 5, the method 1100 further includes forming the back side conductive traces 901-905 extending in x direction in the sixth layer (i.e., the layer below the fifth layer on the back side of the scan flip flop circuit 200, as mentioned above) and the back side conductive traces 1001-1007 extending in y direction in the seventh layer (i.e., the layer below the sixth layer on the back side of the scan flip flop circuit 200, as mentioned above). For example, the back side conductive traces 901-905 and the back side conductive traces 1001-1007 are configured to transmit the supply voltages VSS and BDD to the back side conductive lines 803-804.

In some embodiment, there are no conductive line in the sixth and seventh layers on the back side of the integrated circuit 10 configured to transmit the clock signals clk and clkb, as shown in the cross sectional views in the FIG. 5.

Figure 7:
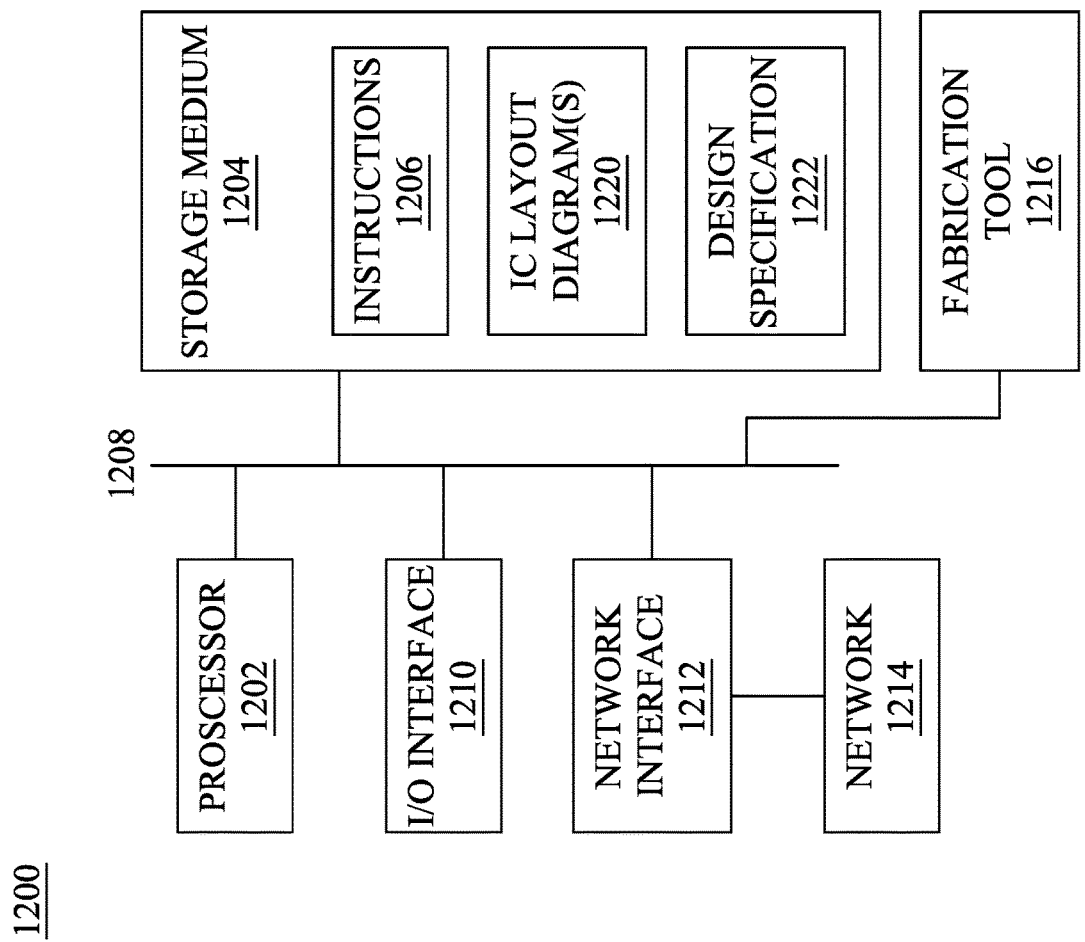
FIG. 7 is a block diagram of a system for designing the integrated circuit layout design, in accordance with some embodiments of the present disclosure.

Reference is now made to FIG. 7. FIG. 7 is a block diagram of an electronic design automation (EDA) system 1200 for designing the integrated circuit layout design, in accordance with some embodiments of the present disclosure. EDA system 1200 is configured to implement one or more operations of the method 1100 disclosed in FIG. 6, and further explained in conjunction with FIGS. 1A-5. In some embodiments, EDA system 1200 includes an APR system.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code (instructions) 1206, i.e., a set of executable instructions. Execution of instructions 1206 by hardware processor 1202 represents (at least in part) an EDA tool which implements a portion or all of, e.g., the method 1100.

The processor 1202 is electrically coupled to computer-readable storage medium 1204 via a bus 1208. The processor 1202 is also electrically coupled to an I/O interface 1210 and a fabrication tool 1216 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. The processor 1202 is configured to execute computer program code 1206 encoded in computer-readable storage medium 1204 in order to cause EDA system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause EDA system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores IC layout diagram 1220 of standard cells including such standard cells as disclosed herein, for example, cells corresponding to the integrated circuits 10, 40, and 50 discussed above with respect to FIGS. 1A-5.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows EDA system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1264. In one or more embodiments, a portion or all of noted processes and/or methods are implemented in two or more systems 1200.

EDA system 1200 also includes the fabrication tool 1216 coupled to processor 1202. The fabrication tool 1216 is configured to fabricate integrated circuits, e.g., the integrated circuits 10, 40, and 50 discussed above with respect to FIGS. 1A-5, according to the design files processed by the processor 1202.

EDA system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as design specification 1222.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1200. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 8:
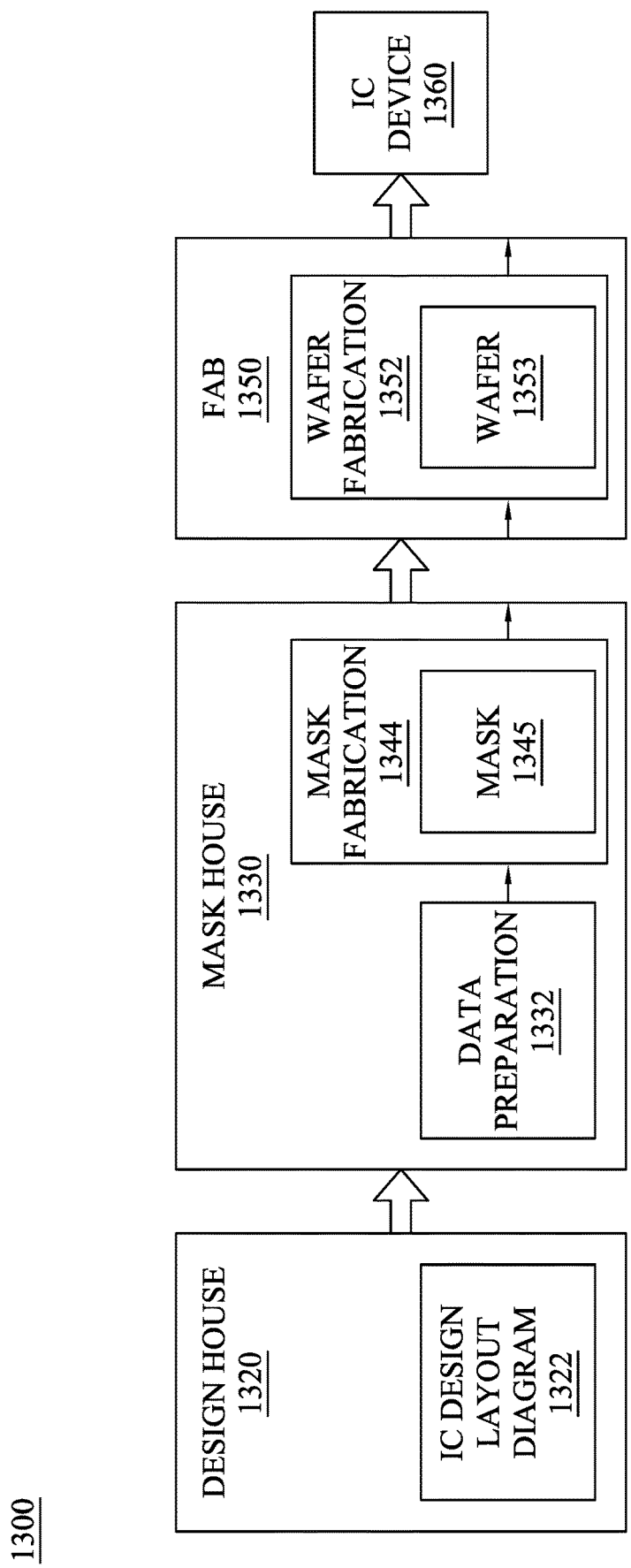
FIG. 8 is a block diagram of an integrated circuit manufacturing system, and an integrated circuit manufacturing flow associated therewith, in accordance with some embodiments.

FIG. 8 is a block diagram of IC manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1300.

In FIG. 8, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single entity. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, for example, an IC layout design depicted in FIGS. 1A, and 3A-5, designed for an IC device 1360, for example, the integrated circuits 10, 40, and 50 discussed above with respect to FIGS. 1A, and 3A-5. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The IC design layout diagram 1322 is manipulated by mask data preparation 1332 to comply with particular characteristics of the mask writer and/or requirements of IC fab 1350. In FIG. 8, data preparation 1332 and mask fabrication 1344 are illustrated as separate elements. In some embodiments, data preparation 1332 and mask fabrication 1344 can be collectively referred to as mask data preparation.

In some embodiments, data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1345 includes a transparent substrate (for example, fused quartz) and an opaque material (for example, chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 includes wafer fabrication 1352. IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

As described above, integrated circuits in the present disclosure include back side conductive lines for transmitting clock signals and supply voltage signals. With the configurations of the present disclosure, the noise disturbance induced by data signals transmitted on a front side of the integrated circuit is eliminated while the conductive lines for the clock signals are not proximate to the data signals and the conductive lines for supply voltage signals shield the conductive lines for the clock signals from disturbance. Hence, an enhanced noise immunity of the integrated circuit is provided.

In some embodiments, an integrated circuit is disclosed, including a first latch circuit, a second latch circuit, and a clock circuit. The first latch circuit transmits multiple data signals to the second latch circuit through multiple first conductive lines disposed on a front side of the integrated circuit. The clock circuit transmits a first clock signal and a second clock signal to the first latch circuit and the second latch circuit through multiple second conductive lines disposed on a backside, opposite of the front side, of the integrated circuit. In some embodiments, the clock circuit includes a first inverter configured to generate the first clock signal. Each transistor in the first inverter includes a first quantity of fin structures. The clock circuit also includes a second inverter configured to generate the second clock signal. Each transistor in the second inverter includes a second quantity of fin structures. The first quantity and the second quantity are different from each other. In some embodiments, the second conductive lines include a first group of conductive lines disposed in a first layer on the back side of the integrated circuit and a second group of conductive lines disposed in a second layer on the back side of the integrated circuit. The first layer is closer to the front side of the integrated circuit than the second layer. In some embodiments, the integrated circuit further includes at least one first via coupled between at least one of the first group of conductive lines and at least one of the second group of conductive lines and at least one second via coupled between the at least one of the first group of conductive lines and at least one gate included in the first latch circuit. In some embodiments, the integrated circuit further includes multiple power rails disposed in the first layer. The first group of conductive lines are interposed between the power rails. In some embodiments, the integrated circuit further includes multiple first power rails. The first power rails and the second conductive lines are disposed in a first layer on the back side of the integrated circuit. At least one of the first power rails includes a first portion extending in a first direction and a second portion extending in a second direction different from the first direction. The at least one of the first power rails surrounds at least one of the second conductive lines in a layout view. In some embodiments, the integrated circuit further includes multiple second power rails extending in the second direction and separate from each other in the first direction and multiple vias coupled between the first power rails and the second power rails. In some embodiments, the integrated circuit further includes multiple power rails disposed in a first layer on the back side of the integrated circuit. At least one of the power rails is L-shaped. The power rails are configured to transmit a first supply voltage and a second supply voltage to the first latch circuit and the second latch circuit. In some embodiments, the integrated circuit further includes multiple first power rails to multiple fourth power rails disposed in first to fourth layers on the back side of the integrated circuit. The first layer is the closest one, of the first to fourth layers, to the front side of the integrated circuit and the fourth layer is the farthest one, of the first to fourth layers, from the front side of the integrated circuit. The first power rails to the fourth power rails are configured to transmit at least one supply voltage to the first latch circuit, the second latch circuit, and the clock circuit. In some embodiments, the second conductive lines including a first group of conductive lines disposed in the first layer and interposed between the first power rails in a layout view and a second group of conductive lines disposed in the second layer and interposed between the second power rails in the layout view.

Also disclosed is an integrated circuit that includes a flip flop circuit including a first cell having a first cell height and a second cell having a second cell height. The flip flop circuit includes a first transistor in the first cell and a second transistor in the second cell. The first transistor includes a first gate and a first active region. The first gate receives a first signal from a first conductive line disposed on a front side of the integrated circuit. The first active region transmits a first clock signal, according to the first signal, to a second conductive line in a first layer on a back side, opposite to the front side, of the integrated circuit. The flip flop circuit further includes a third conductive line disposed in a second layer, below the first layer, on the back side of the integrated circuit and coupled to the second conductive line. The second transistor includes a second gate and a second active region. The second gate receives the first clock signal through a fourth conductive line which is disposed in the first layer on the back side of the integrated circuit and coupled to the third conductive line. The second active region transmits a second clock signal, according to the first clock signal, to a fifth conductive line in the first layer on the back side of the integrated circuit, in which the second clock signal is generated by inverting the first clock signal. In some embodiments, the first cell height and the second cell height are different from each other. In some embodiments, the integrated circuit further includes a first power rail and a second power rail that are disposed in the first layer on the back side of the integrated circuit. The first power rail couples a third active region included in the first transistor to a first supply voltage. The second power rail couples a fourth active region included in the second transistor to the first supply voltage. The second conductive line is interposed between the first power rail and the second power rail. In some embodiments, the integrated circuit further includes multiple the flip flop circuits in multiple flip flop cells. The flip flop cells abut each other along a direction. The integrated circuit further includes a third power rail and a fourth power rail that are disposed in the second layer on the back side of the integrated circuit and pass through the flip flop cells in the direction. The third power rail and the fourth power rail are configured to couple, respectively, the first power rail and the second power rail to the first supply voltage. In some embodiments, the third conductive line extends across the first cell to the second cell. In some embodiments, the integrated circuit further includes a third transistor in the first cell. The third transistor includes a third gate configured to receive the first clock signal through a sixth conductive line which is disposed in the first layer on the back side of the integrated circuit and coupled to the third conductive line.

Also disclosed is a method including the following operations: forming an active device operating as a scan flip flop circuit on a front side of an integrated circuit; forming multiple first conductive lines extending in a first direction in a first layer on a back side of the integrated circuit to transmit a first clock signal and a second clock signal to the active device; forming multiple second conductive lines in the first layer on the back side of the integrated circuit to transmit a first supply voltage and a second supply voltage to the active device, in which the first conductive lines are interposed between the second conductive lines; forming multiple third conductive lines extending in a second direction different from the first direction in a second layer on the back side of the integrated circuit to transmit the first clock signal and the second clock signal between the first conductive lines, in which the first layer is disposed between the second layer and the front side of the integrated circuit; and forming multiple fourth conductive lines extending parallel to the third conductive lines in the second layer on the back side of the integrated circuit to transmit the first supply voltage and the second supply voltage to the second conductive lines, in which the third conductive lines are interposed between the fourth conductive lines. In some embodiments, at least one of the second conductive lines includes a first portion extending in the first direction and a second portion extending in the second direction. In some embodiments, the method further includes forming multiple fifth conductive lines extending in the first direction and multiple sixth conductive lines extending in the second direction in a third layer and a fourth layer, respectively, on the back side of the integrated circuit to transmit the first supply voltage and the second supply voltage to the fourth conductive lines. In some embodiments, the third layer is sandwiched between the second layer and the fourth layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a first latch circuit and a second latch circuit, wherein the first latch circuit is configured to transmit a plurality of data signals to the second latch circuit through a plurality of first conductive lines disposed on a front side of the integrated circuit; and
   a clock circuit configured to transmit a first clock signal and a second clock signal to the first latch circuit and the second latch circuit through a plurality of second conductive lines disposed on a back side, opposite of the front side, of the integrated circuit,
   wherein the clock circuit comprises:
      a first inverter including a plurality of first transistors having a first quantity of fin structures; and
      a second inverter including a plurality of second transistors having a second quantity of fin structure different from the first quantity of fin structure.

2. The integrated circuit of claim 1,
   wherein the first inverter is configured to generate the first clock signal, and
   the second inverter is configured to generate the second clock signal,
   wherein the first quantity is smaller than the second quantity.

3. The integrated circuit of claim 1, wherein the plurality of second conductive lines comprise:
   a first group of conductive lines disposed in a first layer on the back side of the integrated circuit; and
   a second group of conductive lines disposed in a second layer on the back side of the integrated circuit, wherein the first layer is closer to the front side of the integrated circuit than the second layer.

4. The integrated circuit of claim 3, further comprising:
   at least one first via coupled between at least one of the first group of conductive lines and at least one of the second group of conductive lines; and
   at least one second via coupled between the at least one of the first group of conductive lines and at least one gate included in the first latch circuit.

5. The integrated circuit of claim 3, further comprising:
   a plurality of power rails disposed in the first layer, wherein the first group of conductive lines are interposed between the plurality of power rails.

6. The integrated circuit of claim 1, further comprising:
   a plurality of first power rails, wherein the plurality of first power rails and the plurality of second conductive lines are disposed in a first layer on the back side of the integrated circuit,
   wherein at least one of the plurality of first power rails includes a first portion extending in a first direction and a second portion extending in a second direction different from the first direction, wherein the at least one of the plurality of first power rails surrounds at least one of the plurality of second conductive lines in a layout view.

7. The integrated circuit of claim 6, further comprising:
   a plurality of second power rails extending in the second direction and separate from each other in the first direction; and
   a plurality of vias coupled between the plurality of first power rails and the plurality of second power rails.

8. The integrated circuit of claim 1, further comprising:
   a plurality of power rails disposed in a first layer on the back side of the integrated circuit, wherein at least one of the plurality of power rails is L-shaped,
   wherein the plurality of power rails are configured to transmit a first supply voltage and a second supply voltage to the first latch circuit and the second latch circuit.

9. The integrated circuit of claim 1, further comprising:
   a plurality of first power rails to a plurality of fourth power rails disposed in first to fourth layers on the back side of the integrated circuit,
   wherein the plurality of first power rails to the plurality of fourth power rails are configured to transmit at least one supply voltage to the first latch circuit, the second latch circuit, and the clock circuit.

10. The integrated circuit of claim 9, wherein the plurality of second conductive lines comprise:
    a first group of conductive lines disposed in the first layer and interposed between the plurality of first power rails in a layout view; and
    a second group of conductive lines disposed in the second layer and interposed between the plurality of second power rails in the layout view.

11. An integrated circuit, comprising:
    a flip flop circuit including a first cell having a first cell height and a second cell having a second cell height, and comprising:
       a first transistor in the first cell, comprising:
          a first gate configured to receive a first signal from a first conductive line disposed on a front side of the integrated circuit; and
          a first active region configured to transmit a first clock signal, according to the first signal, to a second conductive line in a first layer on a back side, opposite to the front side, of the integrated circuit;
          a third conductive line disposed in a second layer, below the first layer, on the back side of the integrated circuit and coupled to the second conductive line; and
       a second transistor in the second cell, comprising:
          a second gate configured to receive the first clock signal through a fourth conductive line which is disposed in the first layer on the back side of the integrated circuit and coupled to the third conductive line; and
          a second active region configured to transmit a second clock signal, according to the first clock signal, to a fifth conductive line in the first layer on the back side of the integrated circuit, wherein the second clock signal is generated by inverting the first clock signal.

12. The integrated circuit of claim 11, wherein the first cell height and the second cell height are different from each other.

13. The integrated circuit of claim 11, further comprising:
a first power rail and a second power rail that are disposed in the first layer on the back side of the integrated circuit, wherein the first power rail is configured to couple a third active region included in the first transistor to a first supply voltage, and the second power rail is configured to couple a fourth active region included in the second transistor to the first supply voltage,
wherein the second conductive line is interposed between the first power rail and the second power rail.

14. The integrated circuit of claim 13, further comprising:
a plurality of the flip flop circuits in a plurality of flip flop cells, wherein the plurality of the flip flop cells abut each other along a direction; and
a third power rail and a fourth power rail that are disposed in the second layer on the back side of the integrated circuit and pass through the plurality of the flip flop cells in the direction, wherein the third power rail and the fourth power rail are configured to couple, respectively, the first power rail and the second power rail to the first supply voltage.

15. The integrated circuit of claim 11, wherein the third conductive line extends across the first cell to the second cell.

16. The integrated circuit of claim 11, further comprising:
a third transistor in the first cell, comprising:
a third gate configured to receive the first clock signal through a sixth conductive line which is disposed in the first layer on the back side of the integrated circuit and coupled to the third conductive line.

17. A method, comprising:
forming an active device operating as a scan flip flop circuit on a front side of an integrated circuit;
forming a plurality of first conductive lines extending in a first direction in a first layer on a back side of the integrated circuit to transmit a first clock signal and a second clock signal to the active device;
forming a plurality of second conductive lines in the first layer on the back side of the integrated circuit to transmit a first supply voltage and a second supply voltage to the active device, wherein the plurality of first conductive lines are interposed between the plurality of second conductive lines;
forming a plurality of third conductive lines extending in a second direction different from the first direction in a second layer on the back side of the integrated circuit to transmit the first clock signal and the second clock signal between the plurality of first conductive lines, wherein the first layer is disposed between the second layer and the front side of the integrated circuit; and
forming a plurality of fourth conductive lines extending parallel to the plurality of third conductive lines in the second layer on the back side of the integrated circuit to transmit the first supply voltage and the second supply voltage to the plurality of second conductive lines, wherein the plurality of third conductive lines are interposed between the plurality of fourth conductive lines.

18. The method of claim 17, wherein at least one of the plurality of second conductive lines includes a first portion extending in the first direction and a second portion extending in the second direction.

19. The method of claim 17, further comprising:
forming a plurality of fifth conductive lines extending in the first direction and a plurality of sixth conductive lines extending in the second direction in a third layer and a fourth layer, respectively, on the back side of the integrated circuit to transmit the first supply voltage and the second supply voltage to the plurality of fourth conductive lines.

20. The method of claim 19, wherein the third layer is sandwiched between the second layer and the fourth layer.

* * * * *